(12) United States Patent
Nowak et al.

(10) Patent No.: US 9,075,312 B1
(45) Date of Patent: Jul. 7, 2015

(54) UNSATURATED MONOMERIC FORMULATIONS FOR THE FABRICATION OF POLYMERIC WAVEGUIDES

(71) Applicant: HRL Laboratories, LLC, Malibu, CA (US)

(72) Inventors: Andrew P. Nowak, Los Angeles, CA (US); Alan J. Jacobsen, Woodland Hills, CA (US); Sophia S. Yang, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/457,152

(22) Filed: Aug. 12, 2014

Related U.S. Application Data

(62) Division of application No. 13/624,932, filed on Sep. 23, 2012, now Pat. No. 8,906,593.

(51) Int. Cl.
| | |
|---|---|
| *G03F 7/00* | (2006.01) |
| *G03F 7/20* | (2006.01) |
| *G03F 7/031* | (2006.01) |
| *G03F 7/004* | (2006.01) |
| *G03F 7/027* | (2006.01) |

(52) U.S. Cl.
CPC .............. *G03F 7/2002* (2013.01); *G03F 7/031* (2013.01); *G03F 7/0045* (2013.01); *G03F 7/2022* (2013.01); *G03F 7/027* (2013.01)

(58) Field of Classification Search
CPC ....... G03F 7/027; G03F 7/031; G03F 7/0045; G03F 7/2022
See application file for complete search history.

(56) References Cited

U.S. PATENT DOCUMENTS

| | | | |
|---|---|---|---|
| 4,957,850 A | 9/1990 | Kusuda et al. | |
| 7,382,959 B1 | 6/2008 | Jacobsen | |
| 8,017,193 B1 | 9/2011 | Zhou et al. | |
| 2011/0195363 A1* | 8/2011 | Rock et al. .................... | 430/325 |

OTHER PUBLICATIONS

Kewitch and Yariv, "Nonlinear optical properties for projection photolithography," Appl Phys Lett. 68(4) 22 (1996).
Kagami et al., "Light induced three dimensional optical waveguide," Appl Phys Lett. 79(8) 1079 (2001).
Shoji and Kawata, "Optically induced growth of fiber patterns in a photopolymerizable resin," Appl Phys Lett. 75(5) 737 (1999).

(Continued)

*Primary Examiner* — Stewart Fraser
(74) *Attorney, Agent, or Firm* — O'Connor & Company

(57) ABSTRACT

Monomeric formulations appropriate for creating self-propagating polymer optical waveguides, and methods for their fabrication, are disclosed. Multiple polymer waveguides can be fabricated simultaneously into a three-dimensional micro-truss structure, while avoiding significant polymerization outside the confines of the illuminated region. The formulations described to accomplish this controlled polymerization include species containing one or more unsaturated carbon-carbon bonds capable of being free-radical polymerized in the presence of photoinitiator and either a radical inhibitor species or a solvent, or both. The radical inhibitor and/or solvent are included to minimize heat buildup and thermal decomposition of initiator. This invention enhances the versatility of the chemistry by significantly increasing the number of chemical building blocks available for micro-truss fabrication.

18 Claims, 8 Drawing Sheets

(56) References Cited

OTHER PUBLICATIONS

Yamashita et al., "Fabrication of self-written waveguide in photosensitive polyimide resin by controlling photochemical reaction of photosensitizer," Appl Phys Lett. 85(18) 3962 (2004).

Hoyle and Bowman, "Thiol-ene click chemistry," Angew Chem Int Ed. 49 1540 (2010).

Cramer et al., "Thiol-ene polymerization mechanism and rate limiting step changes for various vinyl functional group chemistries," Macromolecules 36 7964-7969 (2003).

* cited by examiner

UNSATURATED MONOMERIC FORMULATIONS FOR THE FABRICATION OF POLYMERIC WAVEGUIDES

PRIORITY DATA

This patent application is a divisional application of U.S. patent application Ser. No. 13/624,932 filed Sep. 23, 2012, now allowed, which is hereby incorporated by reference herein.

FIELD OF THE INVENTION

The present invention generally relates to the formation of polymeric waveguides and to monomeric formulations appropriate for such waveguides.

BACKGROUND OF THE INVENTION

An ordered three-dimensional (3D) microstructure is an ordered 3D structure at the micrometer or nanometer scale. 3D microstructures can be manufactured from polymer materials such as polymer cellular materials. Currently, polymer cellular materials that are mass produced are created through various foaming processes, which all yield random (not ordered) 3D microstructures. 3D microstructures may also be known as "micro-trusses."

A stereolithography technique provides a method to build a 3D microstructure in a layer-by-layer process. This process usually involves a platform that is lowered into a photo-monomer bath in discrete steps. At each layer, a laser is used to scan over the area of the photo-monomer that is to be cured (i.e., polymerized) for that particular layer. Once the layer is cured, the platform is lowered, and the process is repeated until the complete 3D structure is created. Modifications to the stereolithography technique have been developed to improve the resolution by using laser optics and special resin formulations. Modifications have also been developed to decrease the fabrication time of the 3D structure by using a dynamic pattern generator to cure an entire layer at once.

3D ordered polymer cellular structures have also been created using optical interference pattern techniques, also called holographic lithography; however, structures made using these techniques have an ordered structure at the nanometer scale and the structures are limited to the possible interference patterns.

A polymer optical waveguide can be formed in certain photopolymers that undergo a refractive index change during the polymerization process. When a monomer that is photosensitive is exposed to light (e.g., UV light) under the right conditions, the initial area of polymerization, such as a small circular area, will "trap" the light and guide it to the tip of the polymerized region due to the index of refraction change, further advancing that polymerized region. This process will continue, leading to the formation of a waveguide structure with approximately the same cross-sectional dimensions along its entire length. Prior techniques to create polymer optical waveguides have only allowed one or a few waveguides to be formed.

The phenomenon of photopolymerizable resins and their use to create self-propagating polymer waveguides with a collimated beam of light is known and multiple examples are provided, for example, in Kewitch and Yariv, "Nonlinear optical properties for projection photolithography," *Appl Phys Lett.* 68(4) 22 (1996); Kagami et al., "Light induced three dimensional optical waveguide," *Appl Phys Lett.* 79(8) 1079 (2001); Shoji and Kawata, "Optically induced growth of fiber patterns in a photopolymerizable resin," *Appl Phys Lett.* 75(5) 737 (1999); and Yamashita et al., "Fabrication of self-written waveguide in photosensitive polyimide resin by controlling photochemical reaction of photosensitizer," *Appl Phys Lett.* 85(18) 3962 (2004), which are each incorporated by reference herein.

Previous versions of self-propagating polymer optical waveguide systems disclosed monomer formulations based on thiol-ene polymerization, as set forth in U.S. Pat. No. 8,017,193 issued Sep. 13, 2011 to Zhou and Jacobsen at HRL Laboratories, LLC in Malibu, Calif., United States. U.S. Pat. No. 8,017,193 is hereby incorporated by reference herein in its entirety for all purposes. This patent describes formation of a polymeric micro-truss structure using monomer formulations appropriate for a thiol-ene system. This system produces high molecular weight by an alternating reaction between a thyil radical reacting with a terminal unsaturated group followed by the reaction of a hydrogen radical with the carbon-centered radical to regenerate a thyil radical and begin the process again.

While capable of producing a variety of polymeric structures, the available range of monomers along with structural variations and chemical functionality available to such a polymerization system is limited. In particular, the system disclosed in U.S. Pat. No. 8,017,193 is relatively insensitive towards oxygen while growing the network, reducing the need for resin purification and processing. Also, a low amount of heat is evolved upon growth of the network, preventing thermal decomposition of photoinitiator and runaway polymerization outside the regions directly illuminated with UV light. However, the need for low heat release restricts production of micro-truss systems to be limited largely to commercially available species containing multifunctional thiol and unsaturated moieties.

See Hoyle and Bowman, "Thiolz-ene click chemistry," *Angew Chem Int Ed.* 49 1540 (2010) for an overview of the advantages, limitations, and applications of thiol-ene chemistry; and Cramer et al., "Thiol-ene polymerization mechanism and rate limiting step changes for various vinyl functional group chemistries," *Macromolecules* 36 7964-7969 (2003) for a discussion of thiol-ene kinetics.

What are especially needed are improved monomer formulations and methods capable of producing microstructures. These methods ideally would enable micro-truss fabrication with formulations containing unsaturated species as the exclusive reactive group (i.e., without thiol), without runaway polymerizations or inhibition of growing networks from oxygen. It is desired to broaden the range of available monomer system available to the micro-truss. The availability and range of chemical functionality of pure unsaturated polymerization systems is much greater, thus potentially broadening the synthetic choices available to the micro-truss developer.

Such advances could greatly improve the functionality and mechanical properties available to micro-truss structures. In addition, the cost of monomer resins can be decreased due to incorporation of inexpensive monomers used in commodity plastics (e.g., methyl methacrylate) produced industrially in high volume.

SUMMARY OF THE INVENTION

The present invention addresses the aforementioned needs in the art, as will now be summarized and then further described in detail below.

In some variations, the invention provides a formulation for fabricating a plurality of self-propagating polymer optical waveguides, said formulation comprising:

(a) at least one starting molecule containing one or more unsaturated carbon-carbon bonds;

(b) a photoinitiator for initiating a free-radical polymerization of said at least one starting molecule, wherein said photoinitiator is present in a photoinitiator concentration from about 0.01 wt % to about 10 wt %; and (c) a free-radical inhibitor for controlling said free-radical polymerization, wherein said free-radical inhibitor is present in an inhibitor concentration of from about 0.005 wt % to about 5 wt %, wherein said formulation is essentially free of thiol groups; and wherein said photoinitiator concentration and said inhibitor concentration are selected to control formulation heat release, associated with polymerization, outside said polymer optical waveguides.

The starting molecule may be selected from the group consisting of ethylene, substituted olefins, halogenated olefins, 1,3-dienes, styrene, α-methyl styrene, vinyl esters, acrylates, methacrylates, acrylonitriles, acrylamides, N-vinyl carbazole, N-vinyl pyrolidone, and combinations thereof in monomer or oligomer form. In some embodiments, the starting molecule is an acrylate selected from monoacrylates, diacrylates, triacrylates, tetraacrylates, pentaacrylates, or combinations thereof. In some embodiments, the starting molecule is a methacrylate selected from monomethacrylates, dimethacrylates, trimethacrylates, tetramethacrylates, pentamethacrylates, or combinations thereof.

The photoinitiator may be selected from the group consisting of 2-hydroxy-2-methylpropiophenone, camphorquinone, benzophenone, benzoyl peroxide, 2,2-dimethoxy-2-phenylacetophenone, azobisisobutyronitrile, and combinations thereof. In some embodiments, the photoinitiator is capable of generating free radicals under exposure to light with a wavelength selected from about 200 nm to about 500 nm, such as from about 365 nm to about 405 nm. The photoinitiator concentration may be selected from about 0.05 wt % to about 2 wt %, for example.

The free-radical inhibitor may be selected from the group consisting of hydroquinone, methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations thereof. In some embodiments, the inhibitor concentration is selected from about 0.01 wt % to about 1 wt %.

In some embodiments, the formulation further comprises a solvent (such as an aqueous solvent) or inert diluent. For example, a solvent or inert diluent may be selected from the group consisting of cyclohexane, toluene, 1,4-dioxane, xylene, anisole, DMF, DMSO, water, ethanol, methanol, acetone, acetonitrile, chloroform, bulk monomer, derivatized monomer, and combinations thereof. In other embodiments, the formulation is free of solvent, or substantially free of solvent.

Other variations of the invention provide a formulation for fabricating a plurality of self-propagating polymer optical waveguides, said formulation comprising:

(a) at least one starting molecule containing one or more unsaturated carbon-carbon bonds;

(b) a photoinitiator for initiating a free-radical polymerization of said at least one starting molecule, wherein said photoinitiator is present in a photoinitiator concentration from about 0.01 wt % to about 10 wt %; and (c) a non-aqueous solvent for controlling said free-radical polymerization, wherein said formulation is essentially free of thiol groups; and wherein said photoinitiator concentration and said solvent are selected to control formulation heat release, associated with polymerization, outside said polymer optical waveguides.

In some embodiments of these other formulation variations, the starting molecule may be selected from the group consisting of ethylene, substituted olefins, halogenated olefins, 1,3-dienes, styrene, α-methyl styrene, vinyl esters, acrylates, methacrylates, acrylonitriles, acrylamides, N-vinyl carbazole, N-vinyl pyrolidone, and combinations thereof in monomer or oligomer form.

In some embodiments of these other formulation variations, the photoinitiator may be selected from the group consisting of 2-hydroxy-2-methylpropiophenone, camphorquinone, benzophenone, benzoyl peroxide, 2,2-dimethoxy-2-phenylacetophenone, azobisisobutyronitrile, and combinations thereof.

In some embodiments of these other formulation variations, the solvent may be selected from the group consisting of cyclohexane, toluene, 1,4-dioxane, xylene, anisole, DMF, DMSO, ethanol, methanol, acetone, acetonitrile, chloroform, and combinations thereof.

In some embodiments of these other formulation variations, a free-radical inhibitor is also present in an inhibitor concentration of from about 0.005 wt % to about 5 wt %.

Variations of the invention also provide a viscoelastic micro-truss comprising a polymerized form of a formulation that contains:

(a) at least one starting molecule containing one or more unsaturated carbon-carbon bonds;

(b) a photoinitiator for initiating a free-radical polymerization of said at least one starting molecule, wherein said photoinitiator is present in a photoinitiator concentration from about 0.01 wt % to about 10 wt %; and (c) a free-radical inhibitor for controlling said free-radical polymerization, wherein said free-radical inhibitor is present in an inhibitor concentration of from about 0.005 wt % to about 5 wt %, wherein said formulation is essentially free of thiol groups; and wherein said photoinitiator concentration and said inhibitor concentration are selected to control formulation heat release, associated with polymerization, outside said polymer optical waveguides.

Variations of the invention also provide a viscoelastic micro-truss comprising a polymerized form of a formulation that contains:

(a) at least one starting molecule containing one or more unsaturated carbon-carbon bonds;

(b) a photoinitiator for initiating a free-radical polymerization of said at least one starting molecule, wherein said photoinitiator is present in a photoinitiator concentration from about 0.01 wt % to about 10 wt %; and (c) a non-aqueous solvent for controlling said free-radical polymerization, wherein said formulation is essentially free of thiol groups; and wherein said photoinitiator concentration and said solvent are selected to control formulation heat release, associated with polymerization, outside said polymer optical waveguides.

Still other variations enable and provide a method of fabricating a polymeric micro-truss, said method comprising:

(a) selecting at least one starting molecule containing one or more unsaturated carbon-carbon bonds and not containing essentially any thiol groups;

(b) selecting a photoinitiator for initiating a free-radical polymerization of said at least one starting molecule, wherein said photoinitiator is present in a photoinitiator concentration from about 0.01 wt % to about 10 wt %;

(c) selecting a free-radical inhibitor for controlling said free-radical polymerization, wherein said free-radical inhibitor is present in an inhibitor concentration of from about 0.005 wt % to about 5 wt %;

(d) combining said starting molecule, said photoinitiator, and said free-radical inhibitor to generate a monomeric formulation;

(e) transferring said monomeric formulation into a mold;

(f) placing a mask over said monomeric formulation;

(g) exposing selected regions of said monomeric formulation, through said mask, to beams of light, to induce free-radical polymerization;

(h) optionally removing unreacted monomeric formulation; and (i) recovering a polymeric micro-truss comprising a polymerized form of said monomeric formulation.

Yet other variations enable and provide a method of fabricating a polymeric micro-truss, said method comprising:

(a) selecting at least one starting molecule containing one or more unsaturated carbon-carbon bonds and not containing essentially any thiol groups;

(b) selecting a photoinitiator for initiating a free-radical polymerization of said at least one starting molecule, wherein said photoinitiator is present in a photoinitiator concentration from about 0.01 wt % to about 10 wt %;

(c) selecting a non-aqueous solvent for controlling said free-radical polymerization;

(d) combining said starting molecule, said photoinitiator, and said solvent to generate a monomeric formulation;

(e) transferring said monomeric formulation into a mold;

(f) placing a mask over said monomeric formulation;

(g) exposing selected regions of said monomeric formulation, through said mask, to beams of light, to induce free-radical polymerization;

(h) optionally removing unreacted monomeric formulation; and (i) recovering a polymeric micro-truss comprising a polymerized form of said monomeric formulation.

In some method embodiments, the photoinitiator concentration and said inhibitor concentration are selected to control heat release associated with polymerization.

In some method embodiments, the method further comprises purging said monomeric formulation with an inert gas to exclude at least a portion of dissolved oxygen present, if any, prior to step (g).

In step (g) of some method embodiments, said selected regions exposed to said beams of light are collectively from about 1% to about 50% of the total volume of said monomeric formulation, such as from about 5% to about 20% of the total volume of said monomeric formulation.

In some method embodiments, the beams of light possess one or more wavelengths selected from about 200 nm to about 500 nm, such as from about 365 nm to about 405 nm. During step (g), said monomeric formulation may be exposed to light with a power density from about 5 mW/cm$^2$ to about 15 mW/cm$^2$, for example, and for a time period from about 10 seconds to about 15 minutes, for example.

DETAILED DESCRIPTION OF EMBODIMENTS OF THE INVENTION

Figure 1A:
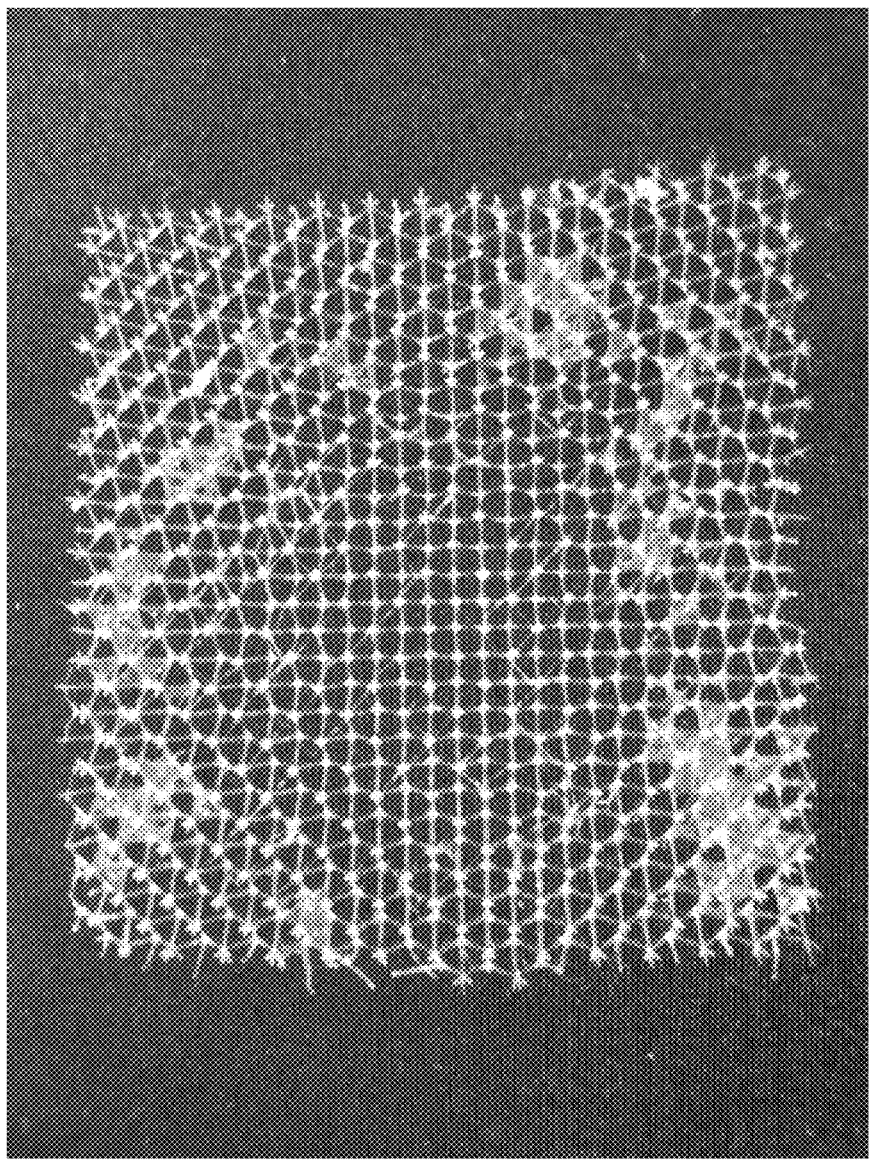
FIG. 1A is a photographic image of the micro-truss of Example 1.

The compositions, apparatus, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Free-radical polymerization of unsaturated species is a well-known field of polymer chemistry. Free-radical polymerization is typically accomplished through generation of a radical species thermally, photochemically, or by ionizing radiation. Radicals (also referred to as free radicals) are atoms, molecules, or ions with unpaired electrons. An unsaturated compound is any organic compound that contains a derivative of ethylene ($H_2C=CH_2$) with one or more hydrogen atoms replaced with some other group(s). Reaction of the radical species with an unsaturated group will produce a larger molecule containing a carbon radical that is, in turn, capable of reacting with another unsaturated monomer. Repetition of this reaction produces a growing linear chain, provided there is adequate stabilization for the growing radical species.

Photopolymers undergo a refractive index change during the polymerization process that can lead to the formation of polymer optical waveguides. If a monomer that is photosensitive is exposed to light (e.g., UV light) under the right conditions, the initial area of polymerization (e.g., a small circular area) will trap the light and guide it to the tip of the polymerized region, further advancing that polymerized region. This process will continue, leading to the formation of a waveguide structure with approximately the same cross-sectional dimensions along its entire length. This phenomenon may be applied to form an interconnected pattern of self-propagating polymer waveguides. The polymeric waveguides may be configured into a micro-truss. As intended herein, "micro-truss" is synonymous and interchangeable with "three-dimensional microstructure," "3D microstructure," and like terms.

Formation of self-propagating polymeric waveguides (see Background) relies on the ability to form high-molecular-weight networks in specific spatial regions of a resin mixture, while leaving remaining monomer largely unreacted. Initiators that will dissociate under exposure to UV radiation provide a source of radical species to create polymeric waveguides. However, the rapid kinetics and exothermic nature of free-radical polymerizations often releases enough heat to thermally decompose photolabile initiators. This process can lead to formation of polymer outside of the volume of resin directly illuminated with light.

In some variations, the present invention is premised on the recognition of this problem and how it can be overcome to suppress runaway thermal polymerization of a photopolymerizable resin. This is necessary in a system such as a micro-truss, in contrast to a single waveguide. In particular, in a micro-truss, multiple self-propagating waveguides comprising a large volume fraction of the overall resin may be formed simultaneously and may generate heat sufficient to thermally decompose initiating species.

The origin of this problem is evident upon inspection of the kinetic rate equation that governs free-radical polymerizations. The rate of polymerization is directly related to the rate of heat generated in a resin undergoing polymerization, since each addition of monomer species to a growing chain has a negative enthalpy change associated with it. In free radical polymerizations the rate equation is:

$$R_p = k_p \sqrt{\frac{f k_d}{k_t}} \sqrt{I_0} \, M_0 e^{-k_d t/2}$$

where $I_0$ and $M_0$ correspond to the initial concentration of monomer and initiator in the resin, respectively. The terms f and $k_d$ are associated with the kinetics of initiator decomposition and characteristic of the specific initiator species chosen. For a given initiator, the rate of polymerization is determined by the kinetics of propagation of new monomer species to growing chains and termination of active chain ends, since $R_p$ varies as $k_p/\sqrt{k_t}$.

For polymerization of unsaturated species in a free-radical manner, $R_p$ is not constant over the course of the reaction. The rate of termination $k_d$ will markedly increase as the polymerization progresses. This is due to the fact that as molecular weight of a resin begins to rise, the viscosity of the medium increases. The rate of propagation, $k_p$, which depends on the rate of diffusion of low-molecular-weight monomer, is largely unaffected during this process. However, the diffusion of high-molecular-weight chains is significantly reduced. This reduction in diffusion limits the ability of growing radical species to find and react with each other through either combination or disproportionation mechanisms. As a result the rate of termination, $k_t$, decreases and the overall rate of polymerization, $R_p$ increases as does the heat evolved. This phenomenon, known as autoacceleration or the Trommsdorff effect, can happen quite rapidly in bulk polymerization of neat resins.

Previous technologies associated with the formation of polymeric waveguides have not realized the need to address this problem. In the case of fabrication of single-strand polymer waveguides, rapid heat buildup and the resulting unwanted decomposition of photoinitiator are not concerns. They are not concerns due to the low volume fraction of illuminated resin to non-illuminated resin, as well as the ability of the large volume of surrounding resin to absorb heat and minimize thermally initiated polymerization outside of the directly illuminated light path (see Kewitch and Yariv, 1996; Kagami et al., 2001; Shoji and Kawata, 1999; and Yamashita et al., 2004, each cited above).

In addition, the reports of polymer resin systems based on thiol-ene polymerization systems (e.g., U.S. Pat. No. 8,017, 193 discussed above) appropriate for formation of self-propagating polymer waveguides are not as susceptible to the rapid rise of heating within the polymer resin upon UV illumination. There is a fundamentally different polymerization mechanism and kinetics in thiol-ene polymerization systems.

In thiol-ene polymerization systems, the chain growth is closely related to a step-growth or polycondensation mechanism. The rate of polymerization is also proportional to $1/\sqrt{k_t}$ as in the pure free-radical case, and termination is determined by bimolecular reaction of two radical species. The strong dependence of $k_t$ on time due to changes in resin viscosity and diffusion does not, however, exist in a thiol-ene system.

In a pure free-radical system, at a given time during polymerization there is a bimodal distribution of high-molecular-weight chains and unreacted monomers with high molecular weight species forming at near zero monomer conversion. Due to this behavior these systems are subject to excessive cyclization, multiple cross-linking, microgelation, low gel point conversion, diffusion-controlled reactions and in general the formation of inhomogeneous networks. In the thiol-ene system, on the other hand, the growth mechanism provides a more even increase in molecular weight of pre-gel species, leading to a steady growth of low-molecular-weight species, and ultimately higher conversions and more homogeneous gelled continuous networks (see Okay and Bowman, "Kinetic modeling of thiol-ene reactions with both step and chain growth aspects," *Macromolecular Theory and Simulations* 2005, 14, 267-277). This removes dependence of $k_t$ on viscosity and allows modeling of thiol-ene systems with the following rate equation:

$$R_p = \sqrt{\frac{R_i}{2k_t}} \left[ \frac{1}{(k_{p1}[C=C])^2} + \frac{1}{(k_{p2}[SH])^2} + \frac{1}{(k_{p1}k_{p2}[C=C][SH])^2} \right]^{-\frac{1}{2}}$$

using the assumption of equivalent termination kinetic parameters for a variety of vinyl species in thiol-ene systems (Cramer, 2003). In this equation, [C═C] is the molar concentration of carbon-carbon double bonds and [SH] is the molar concentration of thiol groups.

Without being bound by any theories, with $k_t$ less sensitive to viscosity increase or time as the reaction conversion proceeds, $R_p$ in thiol-ene systems will not accelerate as found in free-radical systems with their associated rise in heat generation and thermal decomposition of photoinitiator. The heat rise and photoinitiator decomposition in free-radical systems can lead to undesired runaway polymerization outside of the illuminated micro-truss regions, unless the principles of the present invention are applied.

Some variations of the present invention provide a formulation for forming self-propagating polymer optical waveguides, the formulation comprising at least one molecule containing one or more unsaturated carbon-carbon bonds; an effective amount of a photoinitiator for initiating a free-radical polymerization; an effective amount of a free-radical inhibitor for controlling the free-radical polymerization; and optionally a solvent or unreactive diluent.

The formulation is essentially free of thiol groups, in some embodiments, which means that the thiol concentration in the formulation is either zero or is insignificant in terms of final polymer properties. It should be recognized that thiol impurities may be present or that a thiol-based additive may be introduced for reasons other than to serve as a monomer for polymerization.

The molecule containing one or more unsaturated carbon-carbon bonds may be a monomer or an oligomer, i.e. it may be partially polymerized already. The unsaturated carbon-carbon bonds may be double bonds, triple bonds, or a combination thereof. Any molecule containing one or more unsaturated carbon-carbon bonds, which is susceptible to free-radical initiation and thus capable of being polymerized, may be utilized.

According to some embodiments, appropriate monomers for free-radical reactions can be selected from (but not limited to) ethylene, substituted olefins, halogenated olefins, 1,3-dienes, styrene, α-methyl styrene, vinyl esters, acrylates, diacrylates, triacrylates, methacrylates, acrylonitriles, acrylamides, N-vinyl carbazole, N-vinyl pyrolidone, or combinations thereof. Exemplary monomers include, for example, tris(2-hydroxyethyl)isocyanurate triacrylate, dipentaerythritol pentaacrylate, polyethylene glycol diacrylate, trimethylolpropane triacrylate, and combinations or derivatives thereof.

Substituted olefins may include single atoms in place of hydrogen, such as fluorine or chlorine, or groups such as alkyl groups, esters, amine groups, hydroxyl groups, or cyano groups. One or more double bonds or triple bonds can be present in the unsaturated molecules. Also, they can contain different combination of these different multiple bonds. Different structures exhibit different reaction rates. Since various combinations of double or triple bonds may be used in the polymerization process, polymer systems with very different physical properties can be created.

While monomer species with a single unsaturated group are typically capable of forming linear chains, the formation of a solid high-molecular-weight material may be rapidly accelerated through the incorporation of monomer species with multiple polymerizable unsaturated groups, such as diacrylates, tricrylates, or larger acrylates.

The photoinitiator for initiating a free-radical polymerization is any compound which can generate free radicals under light by either intramolecular bond cleavage or intermolecular hydrogen abstraction. One or more different types of photoinitiators may be used in the polymerization process and usually result in different reaction rates. Examples include, but are not limited to, 2-hydroxy-2-methylpropiophenone, camphorquinone, benzophenone, benzoyl peroxide, 2,2-dimethoxy-2-phenylacetophenone, azobisisobutyronitrile, or combinations thereof.

Photoinitiators may be present up to about 10 wt % of the total weight of the polymer. Preferably, the concentration of photoinitators is less than about 5 wt % or less than about 2 wt %, such as from about 0.01 wt % to about 0.1 wt %. Exemplary photoinitator concentrations include about 0.01 wt %, 0.02 wt %, 0.05 wt %, 0.075 wt %, 0.1 wt %, 0.2 wt %, and 0.5 wt % of the total weight of the polymer.

In a photoinitiator, free radicals are generated by the photoinitiator when exposed to an appropriate wavelength of light, such as a wavelength selected from about 200 nm to about 500 nm. Specific wavelengths may be selected, for example, from about 365-366 nm, 385 nm, 395 nm, and 404-405 nm. The source of light may vary, such as fluorescent lamps (e.g. mercury arc lamps) or semiconductor light sources (e.g., light-emitting diodes).

Free-radical inhibitors are components that aid in the suppression of unwanted polymerization outside of light-illuminated regions. A free-radical inhibitor added to the monomeric formulation reduces unwanted polymerization of the regions outside the optical waveguide. Polymerization of the unexposed regions outside the waveguide may occur from residual heat generated from the polymerization reaction or from light that leaks out of the waveguide during light exposure.

Exemplary materials for the free-radical inhibitor may be selected from hydroquinone, methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, or combinations thereof.

The free-radical inhibitor concentration may selected to be between 0 wt % and 5 wt % by weight of the polymer, such as from about 0.005 wt % to about 1 wt %, or about 0.01 wt %, 0.05 wt %, 0.1 wt %, 0.2 wt %, 0.4 wt %, 0.5 wt %, 0.75 wt %, or 0.9 wt % of the total weight of the polymer.

Dilution of polymerizable resin may be accomplished with an appropriate solvent or diluent. In some embodiments, a solvent for the selected monomer is utilized. In other embodiments, there is no intentional solvent added ("neat polymerization"). The choice of solvent may vary widely, such as (for example) cyclohexane, toluene, 1,4-dioxane, xylene, anisole, DMF, DMSO, water, ethanol, methanol, acetone, acetonitrile, chloroform, bulk monomer, derivatized monomer, or combinations thereof.

Free-radical polymerizations of unsaturated monomers can be susceptible to $O_2$ because it acts to scavenge (deactivate) active radical chain ends. As a result, it may be desirable to remove dissolved $O_2$ from the monomer resin. This may be accomplished, for example, by evacuation of the resin mixture or delivering a continuous stream of inert gas (e.g. $N_2$, $CO_2$, or Ar) through the resin mixture for a fixed time period before exposure to light.

Some embodiments of this invention provide a method for preparation of the monomeric formulation. This method may include thoroughly mixing all monomeric species, purging the resin formulation with inert gas to exclude all or substantially dissolved $O_2$, transferring the resin into a mold, placing a mask over the resin, exposing selected regions of the resin through the mask to beams of collimated light, carrying out free-radical polymerization, removing unreacted resin, and recovering a polymerized lattice structure.

The formation of a polymer waveguide requires an index of refraction change between the liquid monomer and the solid polymer. To enable self-propagation of the polymer waveguide, the polymer should be transparent to the wavelength(s) of the light that will be used to generate free radicals and induce polymerization. In addition to these requirements, the reaction should stop, or significantly slow down, when the light exposure is off to avoid over-curing of the monomer that surrounds the polymer waveguide.

In some variations of this invention, a plurality of self-propagating polymer waveguides are created simultaneously using multiple collimated beads of light with a significantly higher volume fraction of the resin under direct illumination compared to a single-strand polymer waveguide. This generates significantly greater heat per total resin volume. The level of heat generated from the polymerization in the illuminated region can lead to undesirable thermal runaway polymerization outside of the illuminated regions and poor fidelity of the final structure with the intended dimensions. In order to prevent unwanted thermally based polymerization in areas not under illumination, thermal decomposition of initiators should be mitigated. This can be accomplished by addition of inhibitor species into the resin and/or by introduction of a solvent such as water capable of absorbing heat and reducing temperature rise.

Embodiments of the present invention provide a polymeric system and a method of using various monomeric formulations that enable the creation of a polymer waveguide suitable for the construction of micro-trusses or other 3D open-cellular polymer structures.

Some embodiments can create a polymer cellular material with an ordered 3D microstructure by creating a pattern of self-propagating optical waveguides in an appropriate photopolymer. Forming single polymer waveguides as well as patterning these polymer waveguides to form an ordered 3D microstructure containing a plurality of self-propagating polymer waveguides, in some embodiments, is described in U.S. Pat. No. 7,382,959 issued Jun. 3, 2008 to Jacobsen, which is hereby incorporated by reference herein in its entirety.

According to some embodiments, a fixed light input (e.g., collimated UV light) is used to cure (polymerize) polymer optical waveguides, which can self-propagate in a 3D pattern. The propagated polymer optical waveguides form an ordered 3D microstructure or micro-truss that can be polymerized without anything moving during the formation process, to enable large-scale, inexpensive production.

In some embodiments, 3D microstructures or other ordered polymer microstructures (including two-dimensional structures) may be designed for a given application. Design parameters may include: the angle and pattern of the polymer waveguides with respect to one another; the packing, or relative density of the resulting cellular structure (the open volume fraction); and the cross-sectional shape and dimensions of the polymer waveguides.

A 3D polymer microstructure may be formed in the area exposed to the incident collimated light beam. Since the incident light and the monomer remain fixed with respect to one another during the formation of a polymer waveguide, the exposure area of the collimated beam(s) may be scanned over a larger surface area of monomer, leading to the formation of large-area structures. Once the polymer cellular structure is formed in the volume of monomer, the remaining unpolymerized material (monomer) is removed, leaving an open cellular polymer material that is the ordered 3D microstructure. A solvent that will dissolve the monomer, but does not dissolve the polymer, may be used to aid in the monomer removal. In certain embodiments, monomer may continuously be fed under a fixed incident light pattern, created from a mask and collimated light.

Generally, multiple polymer waveguides may be created from multiple exposure times using a single collimated beam and a mask with a single aperture and moving the collimated beam with respect to the mask between each exposure. Alternatively, or additionally, multiple polymer waveguides may be created from a single exposure time using multiple collimated beams at different incident angles and a mask with a single aperture.

A three-dimensional ordered polymer microstructure may be fabricated from multiple polymer waveguides that are created from a mask with multiple apertures. The shape and dimensions of the polymer waveguides are dependent on the shape and dimensions of the aperture(s) in the mask. The relative angles of the waveguides in the 3D structure are dependent on the incident angles of the collimated beam. The lengths of the individual polymer waveguides are dependent on the photopolymer and the light source. The area of exposure of the collimated beam(s) and the monomer may be moved with respect to each other to create a structure that is larger than the available exposure area.

The formed polymer cellular materials (3D microstructures) may be used directly, or as templates to form other materials with ordered 3D microstructures, such as metals or ceramics. Because of the simplicity in the processing, as well as the versatility in material options, embodiments of the present invention have a wide range of applications, such as (but not limited to) lightweight structural materials; energy-absorbing materials; heat-transfer applications; deployable structures (such as space structures); conformable core structures; acoustic damping; hook and loop attachments; compliant structures; optics for sub-micron waveguide formation; single body casting/net shape manufacturing; alternate shapes for waveguide members; functionally graded structures; heat exchanger/insulator structures; 3D battery/fuel cell structures; thermal switch structures; catalyst support structures; filtration/separation structures; wicking materials/moisture control structures; directional optical coupler/flexible display structures; distributed lighting structures; electrical interconnects; sensor supports with high surface areas; biological growth templates; flexible body/reactive armors; stealth coatings; high friction/high wear surfaces; waveguides for other energy sources; and flame-retardant foams.

Certain embodiments of the invention will now be further described with reference to the examples, which by no means should be construed to limit the invention. Examples 1, 2, and 3 demonstrate systems formed from purely unsaturated monomer resins. It is shown that with proper selection of thiol-free compositions, clean polymeric micro-truss structures may be successfully fabricated.

In each example, stress-strain and dynamic-frequency measurements are performed on a TA Instruments Q-800 (TA Instruments, Delaware, US). Collimated UV light is generated by a 2 kW Mercury Arc Lamp (Bachur & Associates, California, US). Further details of the exposure set-up are described in U.S. Pat. No. 7,382,959, which has been incorporated by reference. All resins are obtained from Sartomer USA, LLC (Pennsylvania, US) and used without further purification unless otherwise specified. 2-2-dimethoxy-2 phenylacetophenone is a product of Sigma Aldrich (Wisconsin, US) and used as received.

Example 1

In this Example 1, tris(2-hydroxyethyl)isocyanurate triacrylate (19.73 g, Cat#SR368) and dipentaerythritol pentaacrylate (21.0 g, Moles, Cat#SR399) are weighed and thoroughly mixed in a container. 2-2-Dimethoxy-2-phenylacetophenone (20 mg, 0.05 wt %) is weighed out and dissolved in a small volume of acetone before being dispersed into the resin with vigorous mixing. The container is shielded from stray light with foil and placed in a vacuum chamber for 30 min. The monomer formulation is then loaded into a mold and a quartz mask with 225-μm apertures spaced at 2.25 mm in a square array is placed above the resin. The mask and resin combination are exposed to UV light with about 9 mW/cm$^2$ at the resin surface for 30 sec. Following exposure, the unreacted resin is drained and the micro-truss structure rinsed with toluene. The micro-truss is then placed in an 85° C. oven overnight to dry.

Figure 1B:
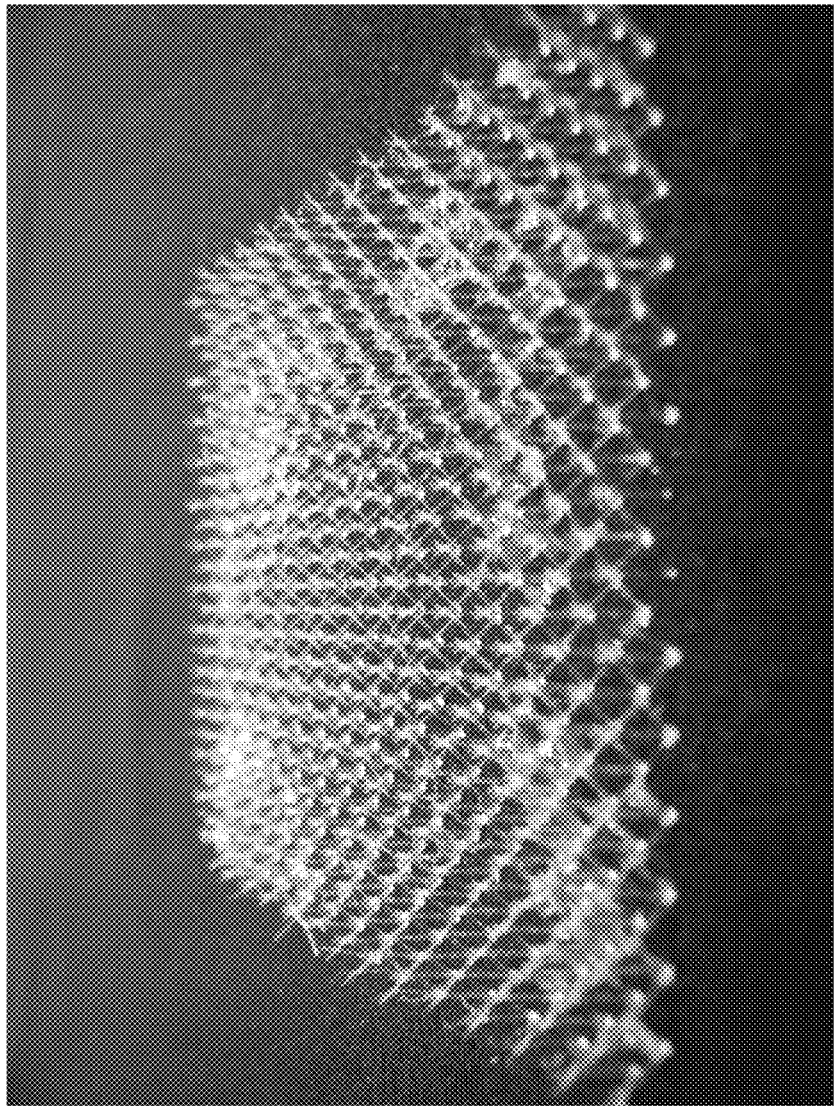
FIG. 1B is a photographic image of the micro-truss of Example 1.
Figure 2:
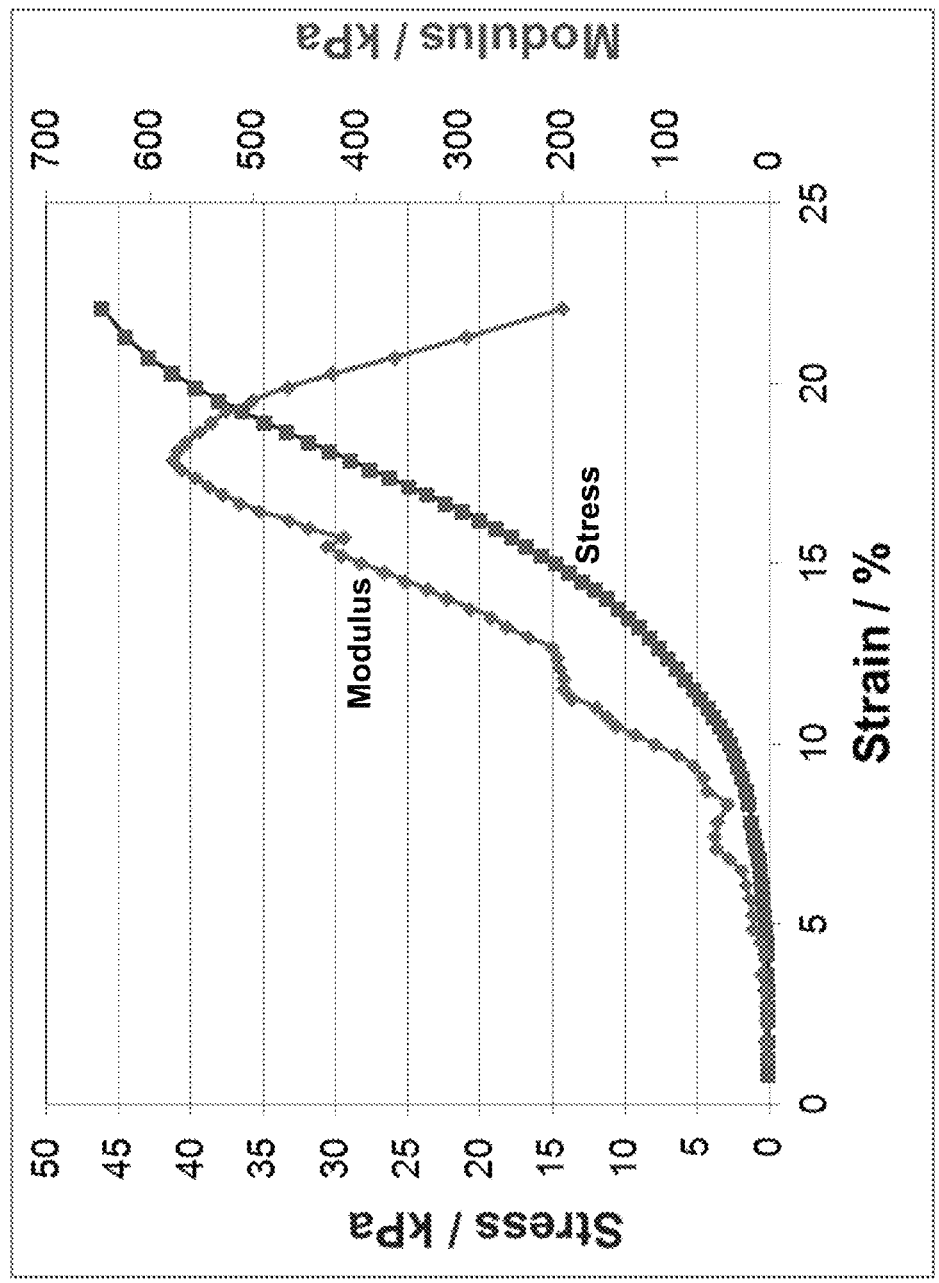
FIG. 2 is a stress-strain curve for the micro-truss of Example 1.
Figure 3:
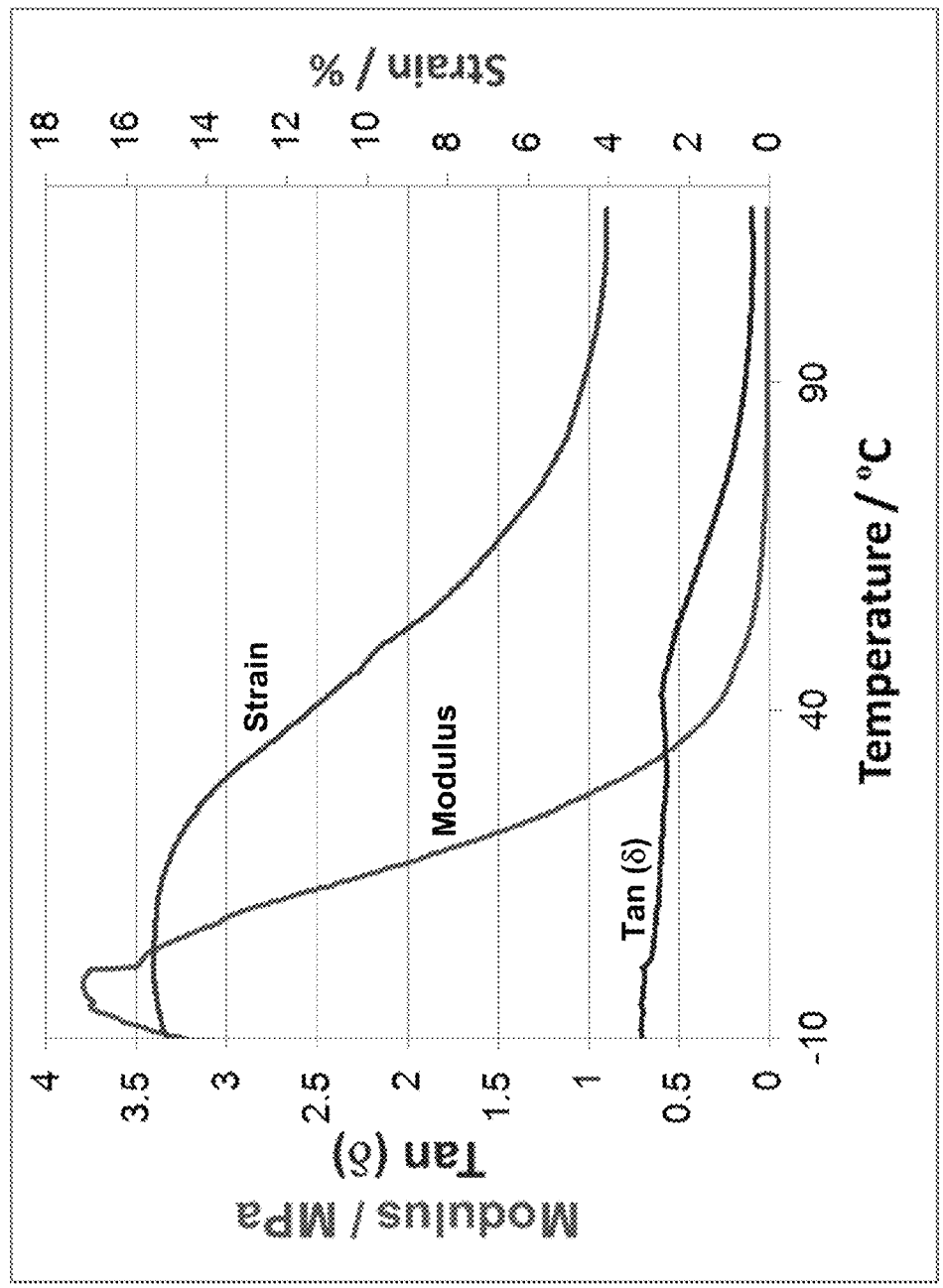
FIG. 3 is a plot of % strain, modulus, and damping ability of the micro-truss as a function of temperature, in Example 1.

FIGS. 1A and 1B show photographic images of the micro-truss fabricated in this Example 1. FIG. 2 is a stress-strain curve for the micro-truss of Example 1. At ambient temperature, the sample is compressed at 100 μm/min starting with an initial thickness of 3.4 mm. The run is terminated upon catastrophic collapse of the structure at approximately 22% strain. FIG. 3 displays mechanical properties of the micro-truss (Example 1) as a function of temperature.

The initial sample is 16 mm (length)×16 mm (width)×3.2 mm (height) and has an initial force of 0.1 N applied for a static stress of 0.39 kPa. The modulus (FIG. 3) is highly temperature-dependent, dropping over an order of magnitude between ambient temperature and 45° C. The structure is quite viscoelastic at lower temperatures with tan(δ) of about 0.6, and decreasing above about 50° C., according to the data in FIG. 3. Tan(δ) is a measure of the damping ability of the material. Considerable expansion is observed beyond 40° C. with the compressive strain dropping from 15% to 4% between ambient temperature and 120° C.

Example 2

In this Example 2, tris(2-hydroxyethyl)isocyanurate triacrylate (17.0 g, Cat#SR368) and trimethylolpropane triacrylate (17.0 g, Moles, Cat#SR351) are weighed and thoroughly mixed in a container. 2-2-Dimethoxy-2-phenylacetophenone (20 mg, 0.05 wt %) is weighed out and dissolved in a small volume of acetone before being dispersed into the resin with vigorous mixing. Tertbutylhydroquinone (1.7 mg, 0.005 wt %) and tetraethylthiurian disulfide (1.7 mg, 0.005 wt %) are also dissolved in a small volume of acetone. The container is shielded from stray light with foil and placed in a vacuum chamber for 30 min. The monomer formulation is then loaded into a mold and a quartz mask with 225-μm apertures spaced at 2.25 mm in a square array is placed above the resin. The mask and resin combination are exposed to UV light (about 9 mW/cm$^2$ at the resin surface) for 25 sec. Following exposure, the unreacted resin is drained and the micro-truss structure rinsed with toluene. The micro-truss is then placed in an 85° C. oven overnight to dry.

Figure 4A:
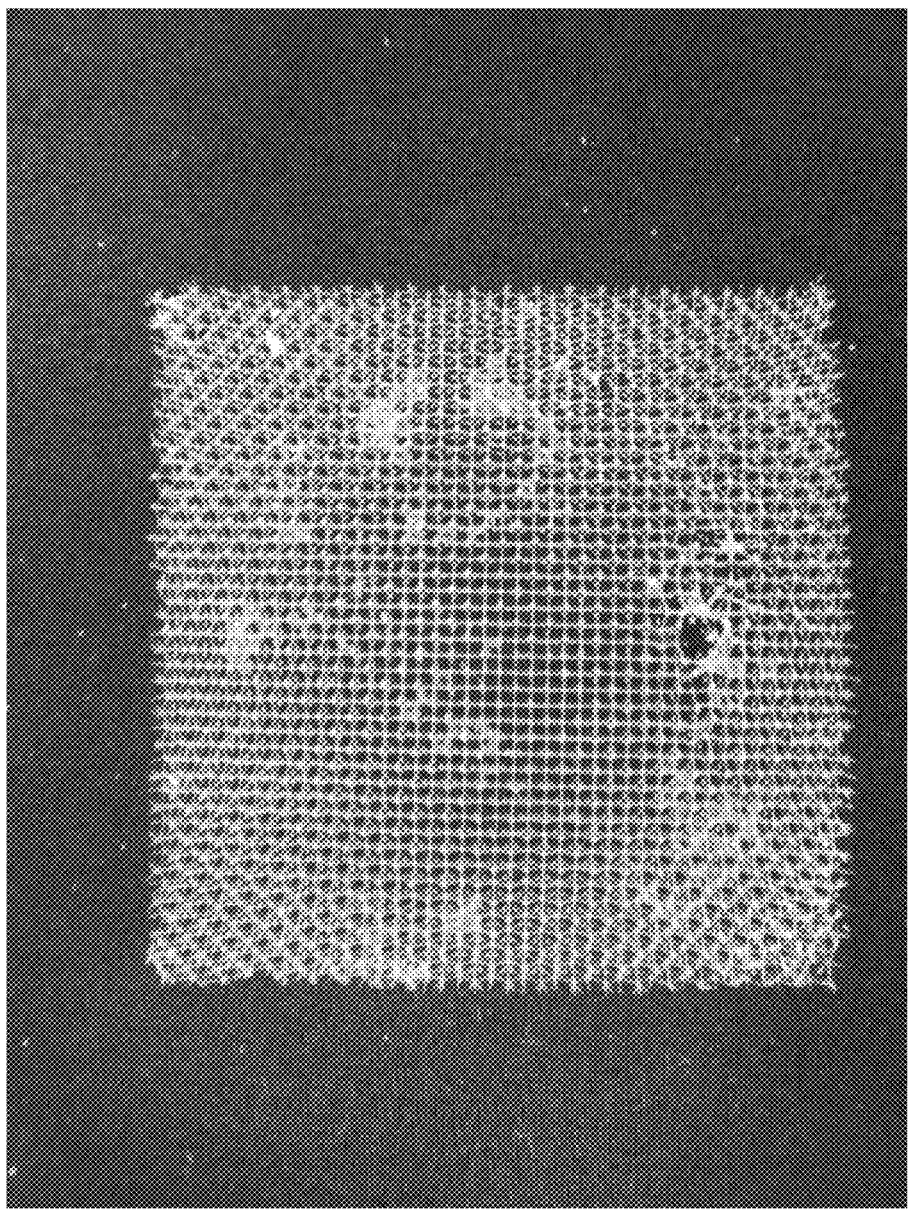
FIG. 4A is a photographic image of the micro-truss of Example 2.
Figure 4B:
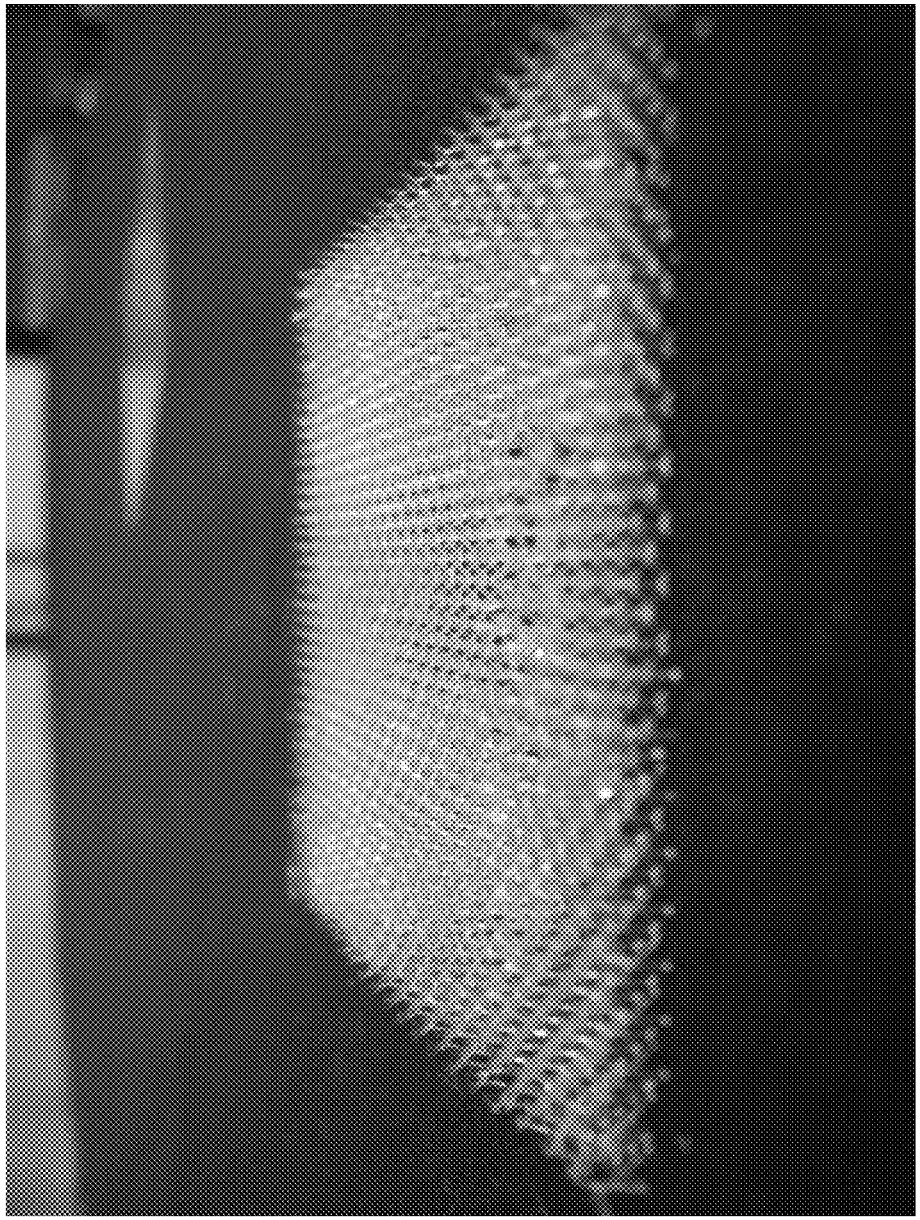
FIG. 4B is a photographic image of the micro-truss of Example 2.

FIGS. 4A and 4B show photographic images of the micro-truss fabricated in this Example 2.

Example 3

In this Example 3, tris(2-hydroxyethyl)isocyanurate triacrylate (15.8 g, Cat#SR368), polyethylene glycol diacrylate (16.0 g, Moles, Cat#SR259), and dipentaerythritol pentaacrylate (8.4 g, Moles, Cat#SR399) are weighed and thoroughly mixed in a container. 2-2-Dimethoxy-2-phenylacetophenone (20 mg, 0.05 wt %) is weighed out and dissolved in a small volume of acetone before being dispersed into the resin with vigorous mixing. The container is shielded from stray light with foil and placed in a vacuum chamber for 30 min. The monomer formulation is then loaded into a mold and a quartz mask with 225-μm apertures spaced at 2.25 mm in a square array is placed above the resin. The mask and resin combination are exposed to UV light (about 9 mW/cm$^2$ at the resin surface) for 40 sec. Following exposure, the unreacted resin is drained and the micro-truss structure rinsed with toluene. The micro-truss is then placed in an 85° C. oven overnight to dry.

Figure 5A:
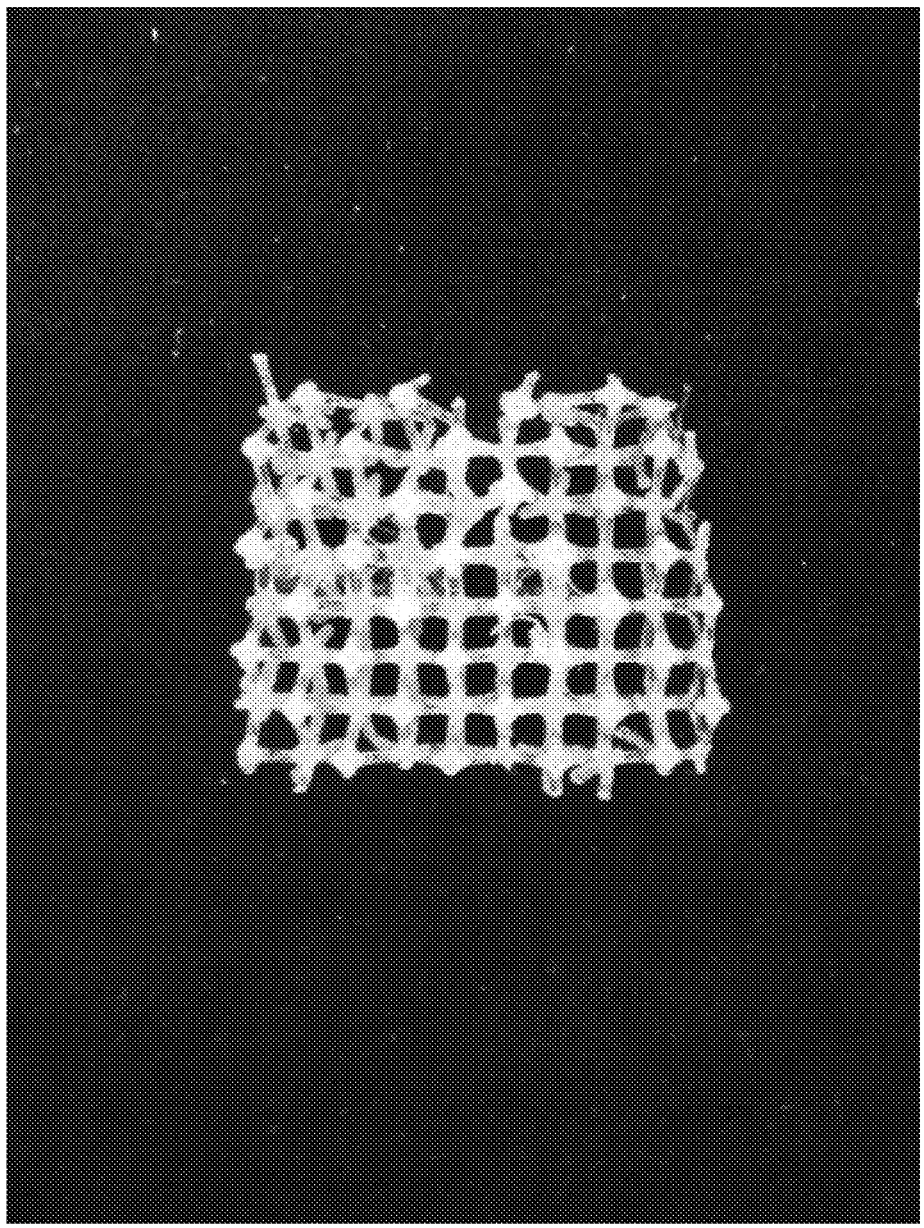
FIG. 5A is a photographic image of the micro-truss of Example 3.
Figure 5B:
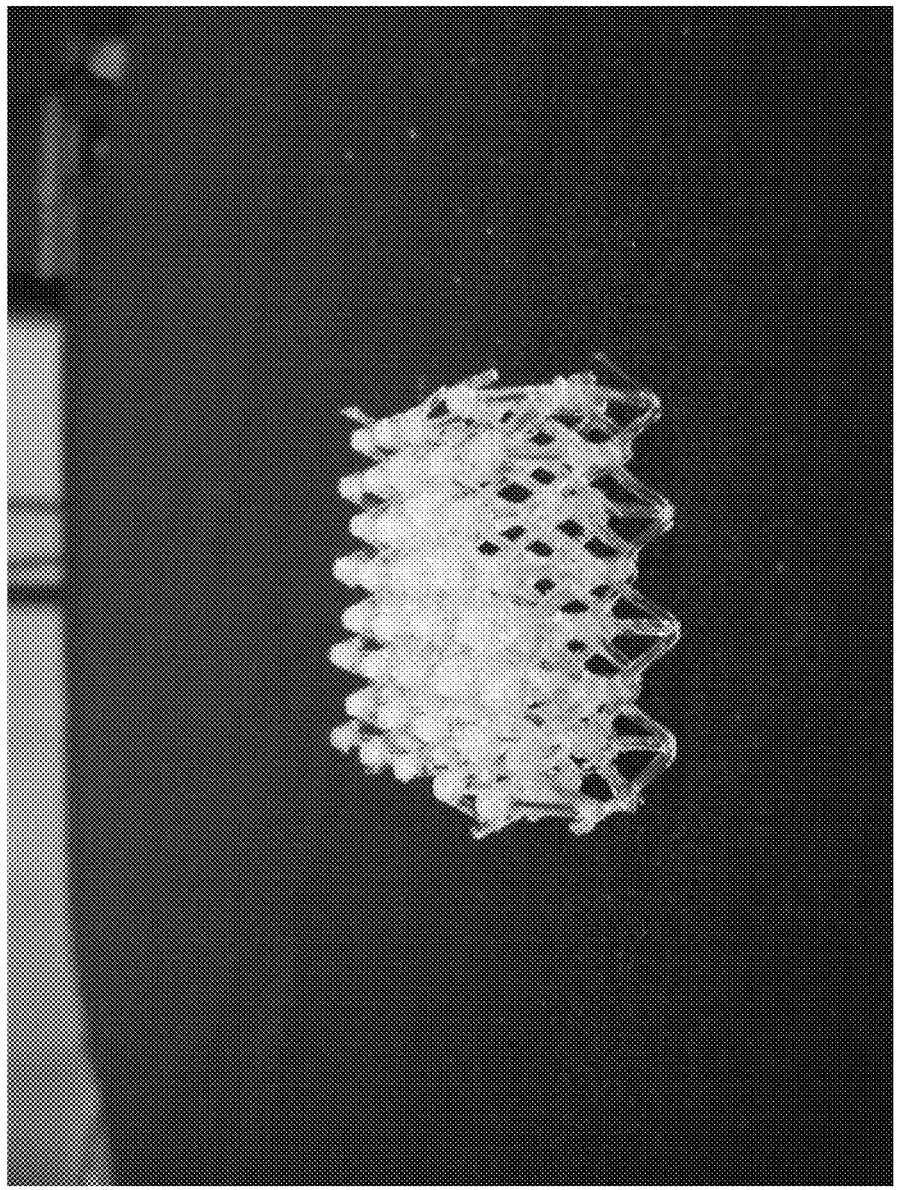
FIG. 5B is a photographic image of the micro-truss of Example 3.

FIGS. 5A and 5B show photographic images of the micro-truss fabricated in this Example 3.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:
1. A method of fabricating a polymeric micro-truss using a monomeric formulation, said method comprising:
 (a) selecting at least one starting molecule containing one or more unsaturated carbon-carbon bonds and not containing essentially any thiol groups;
 (b) selecting a photoinitiator for initiating a free-radical polymerization of said at least one starting molecule, wherein said photoinitiator is present in a photoinitiator concentration from about 0.01 wt % to about 10 wt % based on said monomeric formulation;
 (c) selecting a free-radical inhibitor for controlling said free-radical polymerization, wherein said free-radical inhibitor is present in an inhibitor concentration of from about 0.005 wt % to about 5 wt % based on said monomeric formulation;
 (d) combining said starting molecule, said photoinitiator, and said free-radical inhibitor to generate said monomeric formulation;
 (e) transferring said monomeric formulation into a mold;
 (f) placing a mask over said monomeric formulation;

(g) exposing selected regions of said monomeric formulation, through said mask, to beams of light, to induce free-radical polymerization;

(h) optionally removing unreacted monomeric formulation; and (i) recovering a polymeric micro-truss comprising a polymerized form of said monomeric formulation.

2. The method of claim 1, wherein said photoinitiator concentration and said inhibitor concentration are selected to spatially control heat release associated with polymerization.

3. The method of claim 1, said method further comprising purging said monomeric formulation with an inert gas to exclude at least a portion of dissolved oxygen present, if any, prior to step (g).

4. The method of claim 1, wherein in step (g), said selected regions exposed to said beams of light are collectively from about 1% to about 50% of the total volume of said monomeric formulation.

5. The method of claim 4, wherein in step (g), said selected regions exposed to said beams of light are collectively from about 5% to about 20% of the total volume of said monomeric formulation.

6. The method of claim 1, wherein said beams of light possess one or more wavelengths selected from about 200 nm to about 500 nm.

7. The method of claim 6, wherein said beams of light possess one or more wavelengths selected from about 365 nm to about 405 nm.

8. The method of claim 1, wherein during step (g), said monomeric formulation is exposed to light with a power density from about 5 mW/cm$^2$ to about 15 mW/cm$^2$.

9. The method of claim 1, wherein during step (g), said monomeric formulation is exposed to light for a time period from about 10 seconds to about 15 minutes.

10. A method of fabricating a polymeric micro-truss using a monomeric formulation, said method comprising:

(a) selecting at least one starting molecule containing one or more unsaturated carbon-carbon bonds and not containing essentially any thiol groups;

(b) selecting a photoinitiator for initiating a free-radical polymerization of said at least one starting molecule, wherein said photoinitiator is present in a photoinitiator concentration from about 0.01 wt % to about 10 wt % based on said monomeric formulation;

(c) selecting a non-aqueous solvent for controlling said free-radical polymerization;

(d) combining said starting molecule, said photoinitiator, and said solvent to generate said monomeric formulation;

(e) transferring said monomeric formulation into a mold;

(f) placing a mask over said monomeric formulation;

(g) exposing selected regions of said monomeric formulation, through said mask, to beams of light, to induce free-radical polymerization;

(h) optionally removing unreacted monomeric formulation; and (i) recovering a polymeric micro-truss comprising a polymerized form of said monomeric formulation.

11. The method of claim 10, wherein said photoinitiator concentration and said solvent are selected to spatially control heat release associated with polymerization.

12. The method of claim 10, said method further comprising purging said monomeric formulation with an inert gas to exclude at least a portion of dissolved oxygen present, if any, prior to step (g).

13. The method of claim 10, wherein in step (g), said selected regions exposed to said beams of light are collectively from about 1% to about 50% of the total volume of said monomeric formulation.

14. The method of claim 13, wherein in step (g), said selected regions exposed to said beams of light are collectively from about 5% to about 20% of the total volume of said monomeric formulation.

15. The method of claim 10, wherein said beams of light possess one or more wavelengths selected from about 200 nm to about 500 nm.

16. The method of claim 15, wherein said beams of light possess one or more wavelengths selected from about 365 nm to about 405 nm.

17. The method of claim 10, wherein during step (g), said monomeric formulation is exposed to light with a power density from about 5 mW/cm$^2$ to about 15 mW/cm$^2$.

18. The method of claim 10, wherein during step (g), said monomeric formulation is exposed to light for a time period from about 10 seconds to about 15 minutes.

* * * * *